United States Patent [19]

Fukuoka et al.

[11] Patent Number: 4,518,863
[45] Date of Patent: May 21, 1985

[54] STATIC INDUCTION TRANSISTOR IMAGE SENSOR WITH NOISE REDUCTION

[75] Inventors: Kenji Fukuoka, Fussa; Masatoshi Ida, Hachioji; Atsuo Goto, Hachioji; Toshimasa Akagi, Hachioji; Masaharu Imai, Hino; Kenji Kimura, Tachikawa, all of Japan

[73] Assignee: Olympus Optical Co., Ltd., Tokyo, Japan

[21] Appl. No.: 397,915

[22] Filed: Jul. 13, 1982

[30] Foreign Application Priority Data

Jul. 16, 1981 [JP] Japan .................................. 56-111355

[51] Int. Cl.$^3$ ........................ H01L 27/14; H01L 31/00
[52] U.S. Cl. .................................. 250/578; 250/211 J; 357/32; 358/167; 358/213
[58] Field of Search ............... 250/211 J, 578; 357/30, 357/32; 358/212, 213, 167

[56] References Cited

U.S. PATENT DOCUMENTS

| | | | |
|---|---|---|---|
| 4,145,721 | 3/1979 | Beaudouin et al. | 250/578 X |
| 4,363,963 | 12/1982 | Ando | 357/30 X |
| 4,365,262 | 12/1982 | Nishizawa | 357/30 X |
| 4,407,010 | 9/1983 | Baji et al. | 357/30 X |

Primary Examiner—Edward P. Westin
Attorney, Agent, or Firm—Parkhurst & Oliff

[57] ABSTRACT

A SIT (Static Induction Transistor) image sensor with a high-sensitivity and a high-fidelity is disclosed. The image sensor comprises a SIT image cell array and a scanning circuit which scans in turn a plurality of SIT image cells in such a manner that respective scanning time in all the cells are equal throughout a sequential scanning operation for the SIT image sensor. A reading line and a refreshing line may be combined into a single line. A differential amplifier is provided for correcting a picture element information to remove a noise component therefrom.

8 Claims, 6 Drawing Figures

FIG_4

STATIC INDUCTION TRANSISTOR IMAGE SENSOR WITH NOISE REDUCTION

Background of the Invention

The invention relates to an image sensor. An image sensor which makes use of a static induction transistor (hereinafter referred to as SIT) has been recently developed. Such a SIT image sensor has been known from the IEEE Trans. Electron Devices, ED-26, 1979, PP1970, "Static Induction Transistor Image Sensors". In general, SIT has a high input impedance and a feature of a voltage driving type, denotes an unsaturated current-voltage characteristic like a triode because an output current increases as a voltage increases and further has a high output power, a low distortion and a low noise characteristics.

By way of example, a cell of SIT image sensor is shown in FIGS. 1a and 1b which denote a sectional view of one cell and an equivalent circuit diagram thereof, respectively. The cell is a kind of back exposure type which consists of a reading SIT 1, a phototransistor 2 and a reset SIT 3 and has an amplifying function. If a light beam is made incident upon a transparent electrode 4 of the phototransistor 2 when a positive bias voltage $V_s(t)$ enough to form a depletion layer in a i region 5 of the phototransistor is supplied to the transparent electrode 4, the electrons of electron-hole pairs excited by the light beam are absorbed into the transparent electrode 4 due to the bias voltage $V_s(t)$ and the holes of said pairs are stored in a P+ region 6 shown in FIG. 1a which region is also shown in FIG. 1b by a point a through a depletion layer formed in the i region 5 by an electric field due to the bias voltage $V_s(t)$. A quantity of holes stored in the P+ region 6 is directly proportional to a quantity of incident light into the transparent electrode 4 of the phototransistor 2. A potential $V_b$ at the drain of the reading SIT 1 shown in FIG. 1b by a point b may be indicated by the formula;

$$V_b = Q_p/C_f + \Delta bi$$

wherein $Q_p$ is a charge quantity of the holes stored in the P+ region 6, $C_f$ is a capacitance of the P+ region and $\Delta bi$ is a built-in potential of a diode 2-1 which constitutes a part of the phototransistor 2. The potential $V_b$ may be read through a bit line 8 by making the reading SIT 1 conductive via a reading line 7. The potential $V_b$ may also be nondestructively read so long as the holes stored in the P+ region 6 are not drawn out, namely the gate of the reset SIT 3 which has also the P+ region as its source is not excited through a refreshing line 9. As a result of this, the potential $V_b$ may be read at a next reading stage in such a manner that a next light information entered into the cell after the previous reading has been completed is superimposed on the previously stored light information in the cell.

FIG. 2 shows schematically a conventional SIT image sensor. In this image sensor, a plurality of SIT cells each thereof is shown in FIGS. 1a and 1b are arranged on a semiconductor body in a matrix manner. In FIG. 2, only one cell is shown in order to simplify the drawing. The gates of the reading SITs 1 of a group of cells arranged on each row in the matrix having n rows × m columns are connected together to a related vertical scanning line W-1, W-2, ..., or W-n. The gates of the reset SITs 3 of a group of cells arranged on each row in the matrix are connected together to a related refreshing line R-1, R-2, ..., or R-n. Both of the vertical scanning lines and the refreshing lines are connected to a vertical scanning circuit and reset signal generating circuit 11. The sources of the reading SITs 1 of a group of cells arranged on each column in the matrix are connected together to a related horizontal scanning line B-1, B-2, ..., or B-m. These horizontal scanning lines are connected to a horizontal scanning circuit and video signal output circuit 12.

According to this conventional SIT image sensor, a serial picture information may be obtained by supplying in turn vertical scanning pulses to the vertical scanning lines W-1 to W-n and by scanning in turn the horizontal scanning lines B-1 to B-m during a duration of the vertical scanning pulse supplied to the vertical scanning line.

The SIT image sensor shown in FIG. 2 has an extremely high sensitivity in comparison with a conventional CCD image sensor and a conventional MOS image sensor, because each SIT image cell of the SIT image sensor has an internal amplifying action due to a hook construction thereof. In the CCD image sensor and the MOS image sensor, a picture information is read by deriving, in parallel, respective integrated charges from all the cells or by transferring each integrated charge and each cell is naturally reset as soon as an integrated charge in a cell is drawn out by a reading for the cell.

In contrast with this, an integrated charge is nondestructively read in the SIT image cell and then each cell should be reset before a integrating of charge is started. Therefore, in the SIT image sensor shown in FIG. 2, the refreshing lines R-1 to R-n are provided and reset pulses are simultaneously supplied to all the refreshing lines every a picture information of one frame is obtained to reset all the cells at the same time, or reset pulses are supplied in turn to the refreshing lines to reset every group of the cells connected to respective refreshing lines. However, this SIT image sensor has a defect in that, when serial picture information is to be obtained, the respective exposure times from reset to reading or the respective integrating times of all the cells (or the cells connected to one of the vertical scanning lines W-1 to W-n in case of scanning every vertical scanning line) are different from one another. As a result of this, a brightness irregularity is caused for picture elements and a degree of the irregularity is different according to positions in a picture frame in case of a moving object. This defect become more remarkable as the number of cells constituting the SIT image sensor and then a time required for reading a cell are increased.

As is apparent from FIG. 2, the conventional SIT image sensor has also a defect that the refreshing lines or reset lines R-1 to R-n are required in addition to the vertical scanning lines W-1 to W-n and the horizontal scanning lines B-1 to B-m, which results in the difficulty for manufacturing of the image sensor and the low packing density in the image sensor.

The conventional SIT image sensor further has a defect that the noise such as a spike noise due to the switching of the reading SIT 1 is added to the picture information, as a result of which a signal-to-noise ratio, i.e. S/N in the image sensor is reduced.

SUMMARY OF THE INVENTION

It is an object of the invention to provide an image sensor which may supply a picture information with a high-sensitivity and a high-fidelity.

It is another object of the invention to provide an image sensor having a simple wiring and construction.

It is still another object of the invention to provide an image sensor which may supply a picture information with a high signal-to-noise ratio.

These and other objects of the present invention are achieved by using the SIT image cell and making respective integrating times in all the SIT cells equal throughout a sequential scanning operation, by combining a reading line and a refreshing line into a single line and by providing a correcting means for correcting a picture element information.

BRIEF DESCRIPTION OF THE DRAWINGS

FIG. 1b is an equivalent circuit diagram of the cell shown in FIG. 1a;

DETAILED DESCRIPTION OF THE INVENTION

Figure 1A:
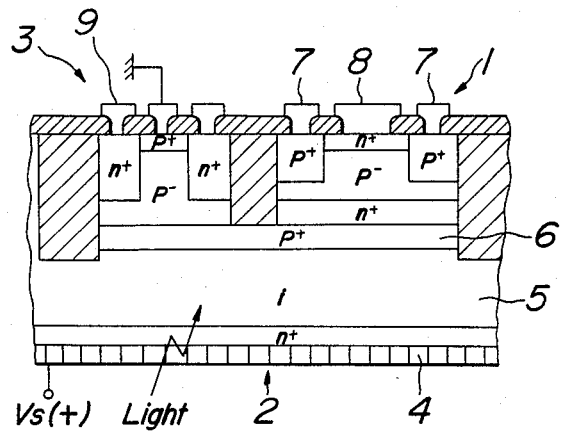
FIG. 1a is a sectional view of a SIT image cell.
Figure 1B:
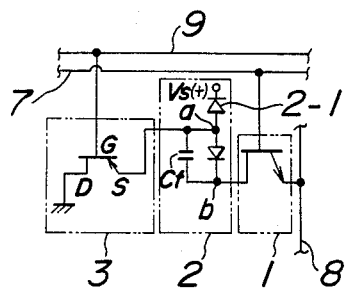
Figure 2:
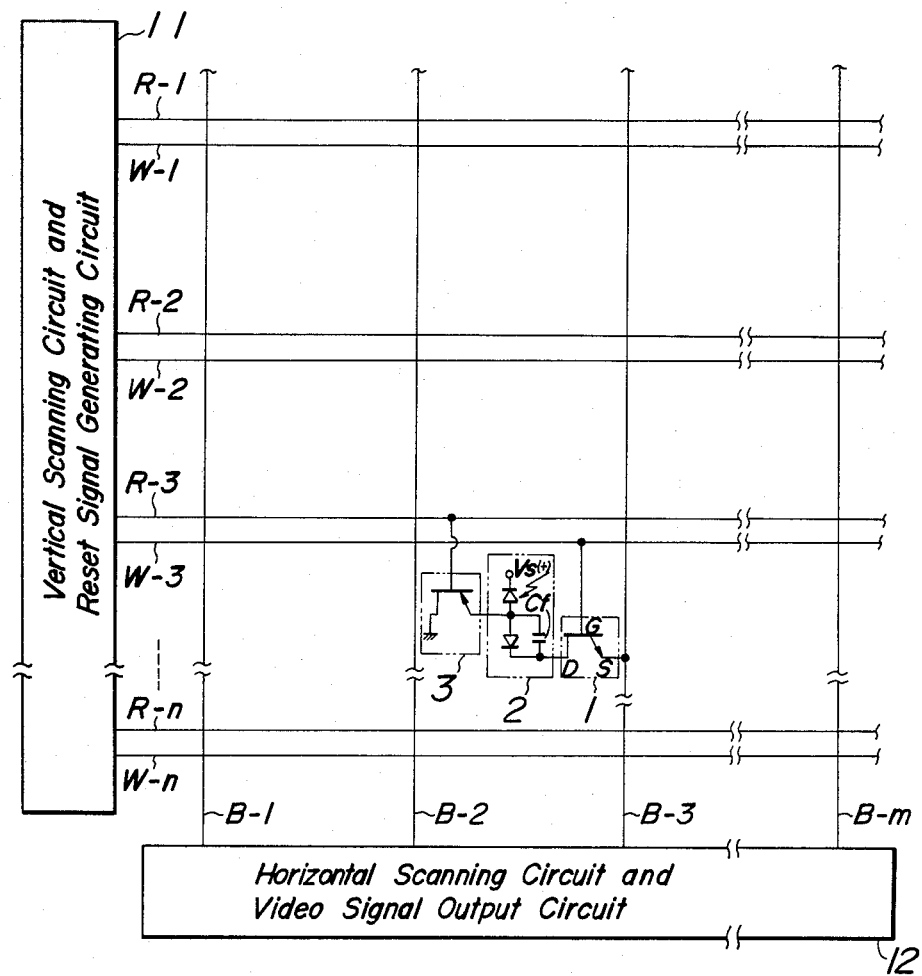
FIG. 2 is a schematic circuit diagram of a conventional SIT image sensor.
Figure 3:
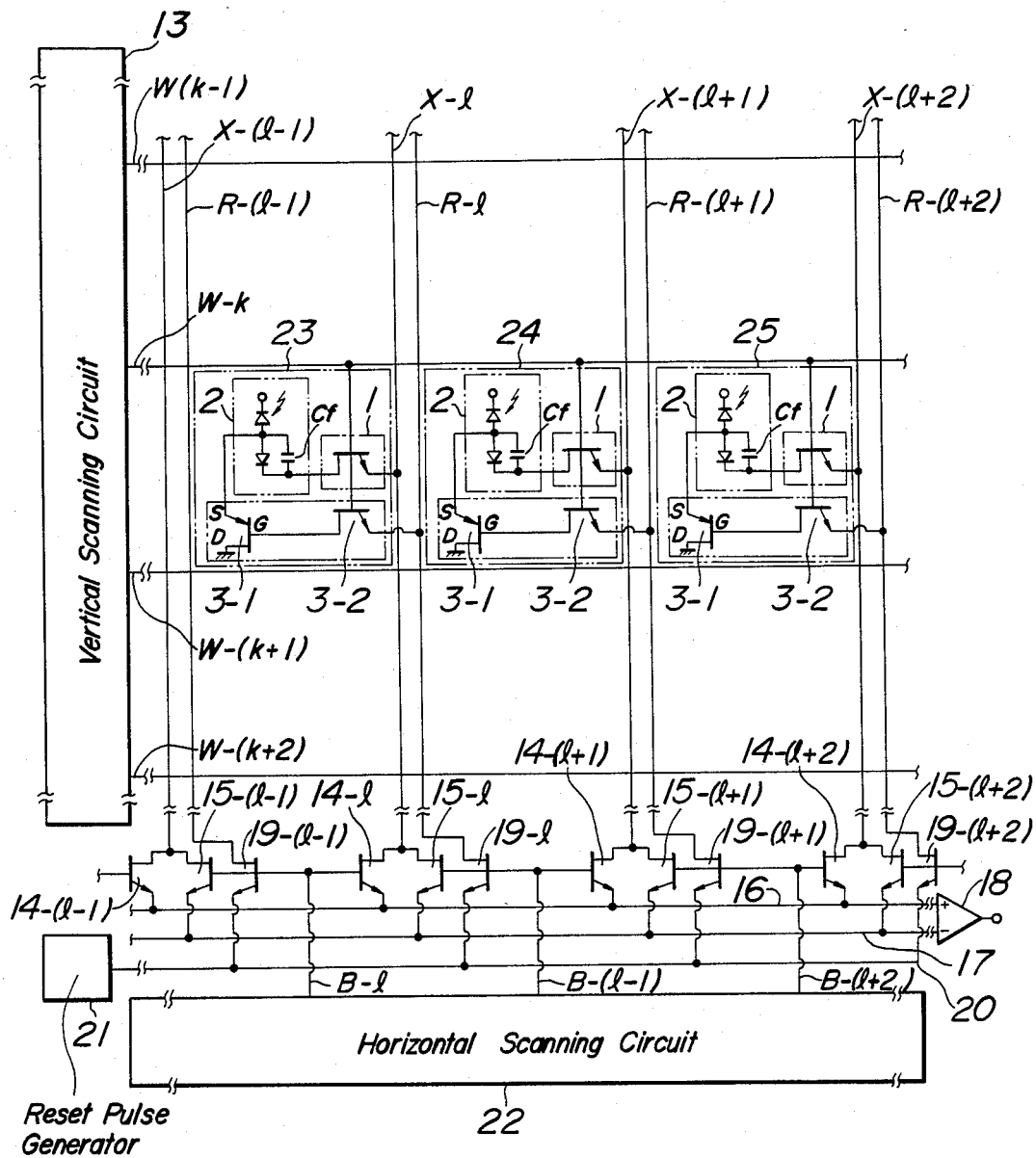
FIG. 3 is a schematic circuit diagram of an embodiment of the SIT image sensor according to the invention.

FIG. 3 shows diagrammatically a SIT image sensor which is an embodiment of the image sensor according to the invention. A plurality of SIT image cells are arranged on a semiconductor body in a two-dimensional matrix manner. For the simplicity of the drawing, three SIT image cells 23, 24 and 25 are only shown in FIG. 3. These SIT image cells are the same as that shown in FIGS. 1a and 1b except that each image cell in FIG. 3 comprises two reset SITs 3-1 and 3-2. The reference numerals 1, 2 and 3 (3-1 and 3-2) in FIG. 3 denote a reading SIT, a phototransistor and a reset SIT, respectively, which have the same function as the elements shown in FIGS. 1a and 1b. In each cell, one reset SIT 3-1 has the P+ region 6 of the phototransistor 2 (see FIG. 1a) as its source and the drain of the SIT 3-1 is grounded. The gate of the reset SIT 3-1 is connected to the drain of the other SIT 3-2 and the gate thereof is connected to the gate of the reading SIT 1. The gates of the reading SITs 1 and the reset SITs 3-2 of a group of cells arranged on each row in the matrix are connected together to a related vertical scanning line. In FIG. 3, the vertical scanning lines W-(k-1), W-k, W-(k+1) and W-(k+2) are only shown for the simplicity of the drawing. All the vertical scanning lines are connected to a vertical scanning circuit 13. The sources of the reading SITs of a group of cells arranged on each column in the matrix are connected together to a related reading line. In FIG. 3, the reading lines X-(l-1), X-l, X-(l+1) and X-(l+2) are only shown in order to simplify the drawing. The reading lines are connected, on one hand, to a picture information reading line 16 through the drain-source paths of the SITs 14-(l−1), 14-l, 14-(l+1) and 14-(l+2), respectively, on the other hand, to a noise component reading line 17 through the drain-source paths of the SITs 15-(l−1), 15-l, 15-(l+1) and 15-(l+2), respectively. The picture reading line 16 and the noise component reading line 17 are connected to a non-inverting input and an inverting input of a differential amplifier 18, respectively. The sources of the reset SITs 3-2 arranged on each column in the matrix are connected together to a related refreshing line. In FIG. 3, the refreshing lines R-(l−1), R-l, R-(l+1) and R-(l+2) only are shown. The refreshing lines are connected to a reset signal line 20 through the drain-source paths of SITs 19-(l−1), 19-l, 19-(l+1) and 19-(l+2), respectively. The reset signal line 20 is connected to a reset pulse generating circuit 21. The gates of SIT 15-(l−1), SIT 19-(l−1) and SIT 14-l are connected to a horizontal scanning line B-l, the gates of SIT 14-l, SIT 19-l and SIT 14-(l+1) to B-(l+1) and the gates of SIT 15-(l+1), SIT 19-(l+1) and SIT 14-(l+2) to B-(l+2), respectively. All the horizontal scanning lines are connected to a horizontal scanning circuit 22.

The operation of the SIT image sensor shown in FIG. 3 is described hereinafter. It is now assumed that the vertical scanning line W-k and the horizontal scanning line B-(l+1) are excited by the pulses from the vertical scanning circuit 13 and the horizontal scanning circuit 22, respectively. Then, the reading SITs 1 and the reset SITs 3-2 of all the cells connected to the line W-k are excited and the reading lines X-l and X-(l+1) and the refreshing line R-l are selected through the SITs 15-l, 19-l and 14-(l+1), respectively. As a result of this, the SIT image cells 23 and 24 which are located at the positions (kth row, lth column) and (kth row, (l+1)th column), respectively, are only caused to be in a reading state. At the same time, a reset pulse is supplied from the reset pulse generating circuit 21 to the selected refreshing line R-l through the reset signal line 20 and the SIT 19-l, so that the image cell 23 is also caused to a reset state. Therefore, the cell 23 is in both reading state and reset state.

In this scanning stage, on one hand, a picture element information of the cell 24 is read and supplied to the non-inverting input of the differential amplifier 18 through the reading line X-(l+1), SIT 14-(l+1) and the picture element reading line 16, on the other hand, a noise component produced in the cell 23 is read and supplied to the inverting input of the differential amplifier 18 through the reading line X-l, SIT 15-l and the noise component reading line 17. The noise component is then subtracted from the picture element information in the differential amplifier 18. In this scanning stage, the image cells other than the cells 23 and 24 continue to integrate an incident light without being read and reset.

In next scanning stage, the cell 24 is reset at the same time when a reading for the cell 25 is started by the citation of the horizontal scanning line B-(l+2). The operation of this stage is equal to that of the former scanning stage. Thereafter, same scanning operation is sequentially carried out by scanning in turn the vertical scanning lines by means of the vertical scanning circuit 13 and by scanning in turn the horizontal scanning lines by means of the horizontal scanning circuit 22 during a duration of the vertical pulse supplied to the vertical scanning line.

According to the SIT image sensor shown in FIG. 3, a certain cell is reset at the same time when a reading for the cell which follows said certain cell is started, namely each cell is reset and then its integrating operation is started immediately after a reading of a picture element information of itself is completed. As a result of this, respective integrating time of all the cells may be identical to each other throughout a sequential scanning operation of the SIT image sensor and a useless time in scanning the cells may be reduced, so that a sensitivity of the sensor may be as higher as possible. Therefore, a picture information with a high-sensitivity and a high-fidelity may be provided by means of the SIT image sensor according to this embodiment.

As a noise component including the spike noise which is derived from the cell in both reset and reading states and a picture element information which is read from the cell in a reading state are respectively supplied to the inverting input and the non-inverting input of the differential amplifier 18, the noise component is removed from the picture element information. Consequently, a picture information with a high S/N may be also obtained at the output of the amplifier 18.

In the image sensor described above, the selection of the reading lines and the refreshing lines is carried out by means of the same and single horizontal scanning circuit 22. However, the circuit 22 may be divided into a scanning circuit for selecting the refreshing lines and a scanning circuit for selecting the reading lines.

Figure 4:
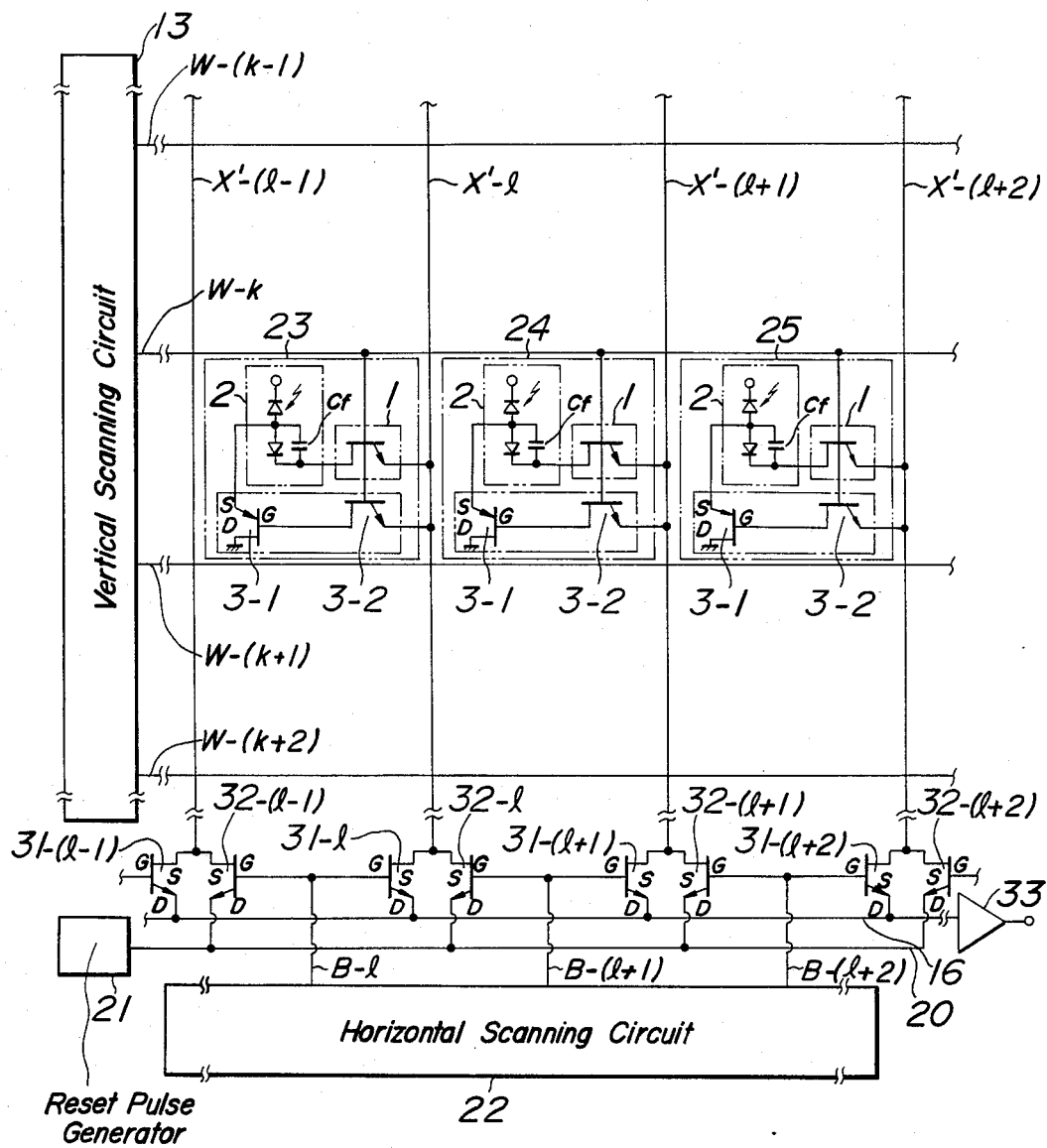
FIG. 4 is a schematic circuit diagram of another embodiment of the SIT image sensor according to the invention.

FIG. 4 diagrammatically shows a SIT image sensor which is another embodiment of the image sensor according to the invention. In this Figure, the elements corresponding to that in FIG. 3 are designated by the same reference signs as used in FIG. 3. According to this SIT image sensor, the sources of the reading SITs 1 and the reset SITs 3-2 of a group of cells arranged on each row in the matrix are connected together to a related reading/refreshing line. In FIG. 4, the reading/refreshing lines X'-(l−1), X'-l, X'-(l+1) and X'-(l+2) are only shown for the simplicity of the drawing. All the reading/refreshing lines are connected, on one hand, to the picture element information reading line 16 through the drain-source paths of the reading SITs 31-(l−1), 31-l, 31-(l+1) and 31-(l+2), respectively, on the other hand, to the reset signal line 20 through the drain-source paths of the reset SITs 32-(l−1), 32-l, 32-(l+1) and 32-(l+2), respectively. The picture element information reading line 16 is connected to a signal detecting circuit 33 from the output of which a serial picture information is derived. Other constructions of the image sensor in FIG. 4 are the same as that in FIG. 3.

In the image sensor shown in FIG. 4, it is assumed that the vertical scanning line W-k and the horizontal scanning line B-(l+1) are now excited and then the reading/refreshing lines X'-l and X'-(l+1) are selected through the SITs 32-l and 32-(l+1), respectively. At the same time, a reset pulse is supplied from the reset pulse generating circuit 21 to the selected reading/refreshing line X'-l through the reset signal line 20 and the SIT 32-l. Accordingly, in this scanning stage, the cell 24 is in a reading state and the cell 23 is in a reset state. Then, a picture element information of the cell 24 is read and supplied to the signal detecting circuit 33 through the reading/refreshing line X'-(l+1), SIT 32-(l+1) and the picture element reading line 16. After the reading for the cell 24 is completed, the next scanning stage is carried out in which the cell 24 is reset and the cell 25 is read. Hereafter, same scanning operation is sequentially performed in the same way as the image sensor in FIG. 3.

According to the SIT image sensor shown in FIG. 4, in the same way as the image sensor in FIG. 3, respective integrating time of all the cells may be identical to each other throughout a sequential scanning operation of the SIT image sensor and a useless time in scanning the cells may be reduced, so that a sensitivity of the sensor may be as higher as possible. Therefore, a picture information with a high-sensitivity and a high-fidelity may be provided by means of the SIT image sensor according to the embodiment.

Also, the reading/refreshing line which is a combination of the reading line and the refreshing line in FIG. 3 is employed, so that a wiring and then a manufacturing of the SIT image sensor may be simple and a packing density in the image sensor may be increased.

In this SIT image sensor, the reading SITs 31-(l−1), 31-l, 31-(l+1) and 31-(l+2) and the reset SITs 32-(l−1), 32-l, 32-(l+1) and 32-(l+2) are driven by means of the same and single horizontal scanning circuit 22. However, the circuit 22 may be divided into a scanning circuit for the reading SITs and a scanning circuit for the reset SITs.

Figure 5:
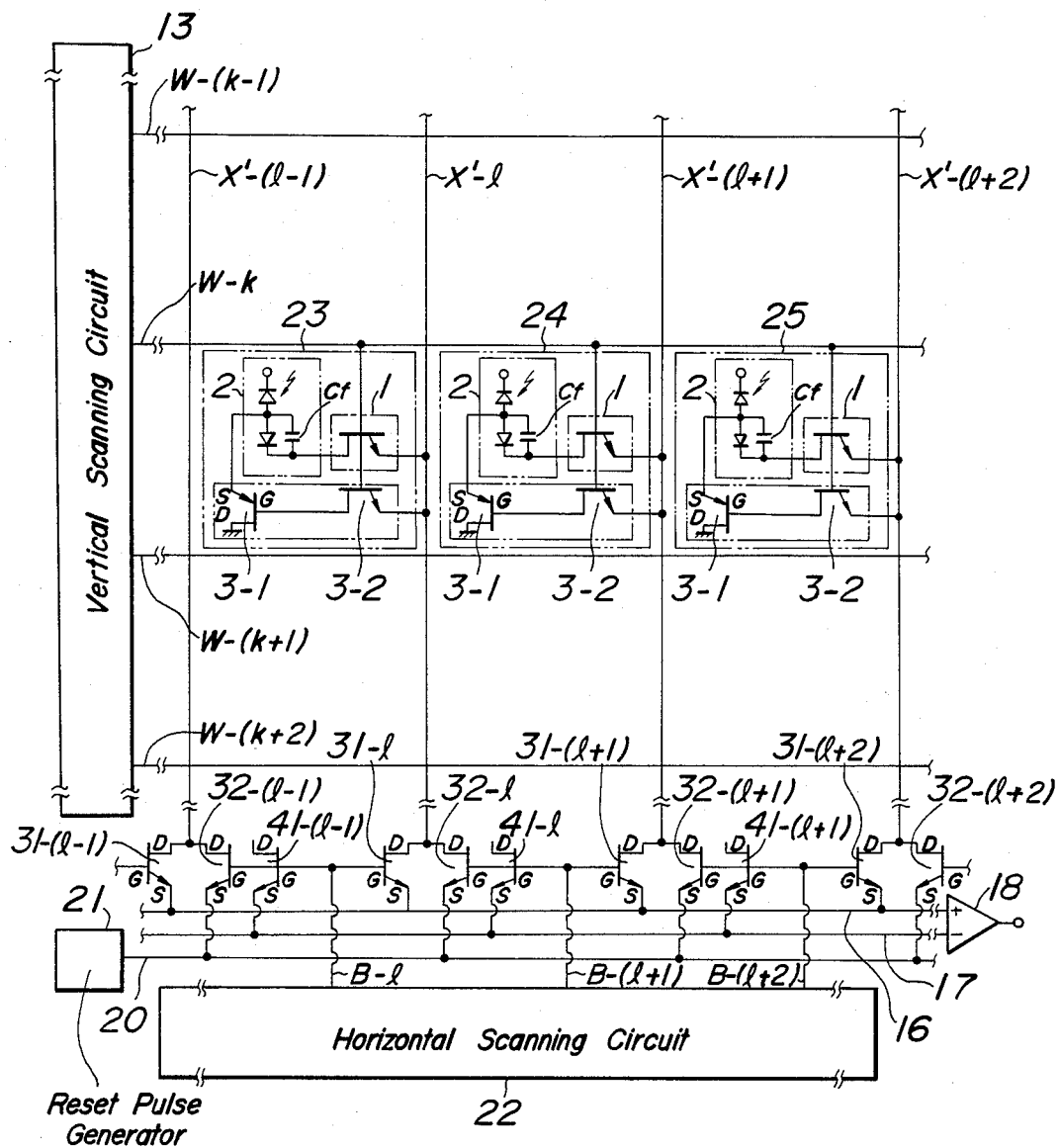
FIG. 5 is a schematic circuit diagram of still another embodiment of the SIT image sensor according to the invention.

FIG. 5 shows diagrammatically a SIT image sensor which is a still another embodiment of the image sensor according to the invention. In this Figure, the elements corresponding to that in FIGS. 3 and 4 are designated by the same reference signs as used in these Figures.

The image sensor is provided with a plurality of SITs each having a floating drain D, in FIG. 5 the SITs 41-(l−1), 41-l and 41-(l+1) only being shown. The sources of these SITs are connected together to the noise component reading line 17 which is connected to the inverting input of the differential amplifier 18. These SITs are driven by the excitation of the horizontal scanning lines B-l, B-(l+1) and B-(l+2), respectively. The reading/refreshing lines X'-(l−1), X'-l, X'-(l+1) and X'-(l+2) are connected to the picture element information reading line 16 through the drain-source paths of the reading SITs 31-(l−1), 31-l, 31-(l+1) and 31-(l+2), respectively. The information reading line 16 is connected to the non-inverting input of the differential amplifier 18 from the output thereof a serial picture information may be derived. Other constructions of the image sensor in FIG. 5 are the same as that in FIG. 4. Also, the same scanning operation as that in FIG. 4 is carried out in the SIT image sensor in FIG. 5.

According to this SIT image sensor, a spike noise may be generated from the drived SIT having a floating drain when a picture element information is read from the cell in a reading state and the spike noise is subtracted from the picture element information in the differential amplifier 18. As a result of this, a picture information with a high S/N may be obtained at the output of the amplifier 18. Furthermore, it is apparent that this SIT image sensor has also the effects obtained by the sensor in FIG. 4. Also, the circuit 22 may be divided into a scanning circuit for the reading SITs and a scanning circuit for the reset SITs.

Although the invention has been described in its preferred embodiments, it is to be understood by those skilled in the art that various changes and modifications may be made in the invention without departing from the spirit and scope thereof. For instance, the invention is applicable to not only the SIT image sensor but also various semiconductor image sensors. Also, in the image sensor described, two cells which are respectively read and reset at the same time are located adjacently but it is possible to select two cells at intervals of one or more cells. Said two cells may be respectively read and reset not only at the same time but also at a certain time relation.

What is claimed is:

1. An image sensor comprising:

a semiconductor image cell array having a plurality of semiconductor image cells arranged in a matrix, each semiconductor image cell of said matrix including a photoelectric transducer which transforms incident light into an electric charge and integrates that electric charge, a read switching means comprising a static induction transistor coupled to said transducer for reading said transducer to provide and output signal representing said integrated electric charge, and a reset switching means coupled to said transducer for resetting said photoelectric transducer; and means for sequentially scanning each of said semiconductor image cells in such a manner that while one cell is being read the next preceding cell is being reset to cause resetting of each preceding cell simultaneous with the reading of a scanned cell so that the integration time between reset and reading of each cell is substantially the same for all cells.

2. The image sensor of claim 1 wherein said means for scanning comprises a first scanning circuit and a second scanning circuit, and wherein said image cell array is defined by a plurality of rows and columns of said image cells, said first scanning circuit being coupled to provide a plurality of scanning lines, wherein each scanning line is commonly coupled to the read and reset switching means of the group of image cells forming one of the rows of said array and wherein said second scanning circuit includes a plurality of reading line and reset line pairs, each of the reading lines of said pairs being coupled in common to the read switching means of the group of image cells forming one of the columns of the array and the reset line of that same pair being coupled in common to the reset switching means of the group of image cells forming the same column of the array.

3. The image sensor of claim 1 wherein said means for scanning comprises first and second scanning circuits and wherein said image cell array is defined by a plurality of rows and columns of said image cells, said first scanning circuit including a plurality of first scanning lines wherein each scanning line is coupled in common to the read and reset switching means of the group of cells forming one of the rows of said array and said second scanning circuit includes a plurality of second scanning lines wherein each second scanning line is coupled in common to the read and reset switching means of the group of image cells forming one of the columns of the array.

4. The image sensor of claim 2 wherein said image sensor further comprises means for correcting information represented by the integrated electric charge read from each scanned cell with a component of noise derived by the simultaneous reading of the next preceding cell.

5. The image of sensor of claim 4 wherein each semiconductor image cell is constructed such that the photoelectric transducer is a photo transistor and said reset switching means includes at least one static induction transistor.

6. The image sensor of claim 3 wherein each semiconductor image cell is constructed such that said photoelectric transducer is a photo transistor and said reset switching means includes at least one static induction transistor and wherein said image sensor further includes a plurality of static induction transistors each having a floating drain and means for correcting information represented by the integrated electric charge read from each scanned cell with a noise component derived from a selected one of said plurality of static induction transistors having a floating drain.

7. The image sensor of claims 4, 5 or 6 wherein said means for correcting includes a differential amplifier having first and second terminals wherein said first terminal is coupled to receive said output signal representing said integrated electrtic charge of a scanned cell and said second terminal is coupled to receive said noise component for subtraction from said output signal.

8. An image sensor comprising:
a semiconductor image cell array having a plurality of semiconductor image cells arranged in a matrix, each semiconductor image cell of said matrix including a photoelectric transducer which transforms incident light into an electric charge and integrates that electric charge, a read switching means coupled to said transducer for reading said transducer to provide an output signal representing said integrated electric charge, and a reset switching means coupled to said transducer for resetting said photoelectric transducer; and means for sequentially scanning each of said semiconductor image cells in such a manner that while one cell is being read the next preceding cell is being reset to cause resetting of each preceding cell simultaneous with the reading of a scanned cell so that the integration time between reset and reading of each cell is substantially the same for all cells.

* * * * *